(12) United States Patent
Nagahara et al.

(10) Patent No.: US 10,971,241 B2
(45) Date of Patent: Apr. 6, 2021

(54) PERFORMANCE BASED METHOD AND SYSTEM FOR PATROLLING READ DISTURB ERRORS IN A MEMORY UNIT

(71) Applicant: TOSHIBA MEMORY CORPORATION, Minato-ku (JP)

(72) Inventors: Tadashi Nagahara, Tokyo (JP); Franklin Antony muthu Sunder, Bangalore (IN)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 244 days.

(21) Appl. No.: 15/463,750

(22) Filed: Mar. 20, 2017

(65) Prior Publication Data

US 2018/0217769 A1   Aug. 2, 2018

(30) Foreign Application Priority Data

Jan. 30, 2017  (IN) .............................. 201741003371

(51) Int. Cl.
  *G06F 3/06*  (2006.01)
  *G11C 16/34*  (2006.01)
  *G06F 11/10*  (2006.01)
(52) U.S. Cl.
  CPC ............ *G11C 16/349* (2013.01); *G06F 11/10* (2013.01); *G11C 16/3418* (2013.01); *G11C 16/3427* (2013.01); *G11C 16/3431* (2013.01)
(58) Field of Classification Search
  CPC ........................... G11C 16/3431; G06F 11/10
  See application file for complete search history.

(56) References Cited

U.S. PATENT DOCUMENTS

| | | | |
|---|---|---|---|
| 6,738,875 B1 * | 5/2004 | Wang ................. | G06F 12/0269 707/999.202 |
| 8,045,309 B2 | 10/2011 | Shimada | |
| 9,548,108 B2 * | 1/2017 | Yu ...................... | G11C 16/3431 |
| 2003/0225961 A1 * | 12/2003 | Chow ................. | G06F 3/0616 711/103 |

(Continued)

FOREIGN PATENT DOCUMENTS

| | | |
|---|---|---|
| JP | 2008-192153 | 8/2008 |
| JP | 2014-507724 | 3/2014 |
| JP | 2016-122227 | 7/2016 |

*Primary Examiner* — Charles Rones
*Assistant Examiner* — Tian-Pong Chang
(74) *Attorney, Agent, or Firm* — Oblon, McClelland, Maier & Neustadt, L.L.P.

(57) ABSTRACT

Disclosed herein is a method and a system for handling read disturb errors in a memory unit. Status information related to each memory block in the memory unit is retrieved and plurality of target memory blocks with valid pages and having highest block erase count are identified for patrolling. Each valid page in the target memory blocks are patrolled for identifying read disturb errors. Finally, each valid page having read disturb errors are recycled, thereby effectively handling the read disturb errors in the memory unit. The method disclosed herein involves patrolling of only the valid pages in the memory block, thereby reducing the time required for handling the read disturb errors and improving the overall performance. Also, the method ensures data retention reliability within each memory blocks by patrolling the memory block in the order of highest block erase counts.

21 Claims, 12 Drawing Sheets

(56) References Cited

U.S. PATENT DOCUMENTS

| | | | |
|---|---|---|---|
| 2008/0189485 A1 | 8/2008 | Jung et al. | |
| 2009/0235013 A1 | 9/2009 | Seo | |
| 2011/0235434 A1* | 9/2011 | Byom | G11C 16/10 365/185.25 |
| 2012/0198129 A1 | 8/2012 | Van Aken et al. | |
| 2013/0346805 A1* | 12/2013 | Sprouse | G11C 16/3418 714/42 |
| 2014/0040586 A1* | 2/2014 | LeGendre | G06F 12/0253 711/166 |
| 2015/0052415 A1* | 2/2015 | Um | G06F 11/1056 714/768 |
| 2015/0113205 A1* | 4/2015 | Cai | H03M 13/1102 711/103 |
| 2015/0227418 A1* | 8/2015 | Cai | G06F 11/1048 714/768 |
| 2016/0188220 A1 | 6/2016 | Nemoto et al. | |
| 2017/0160989 A1* | 6/2017 | Hsieh | G06F 3/061 |
| 2018/0357166 A1* | 12/2018 | Yu | G06F 12/0646 |

\* cited by examiner

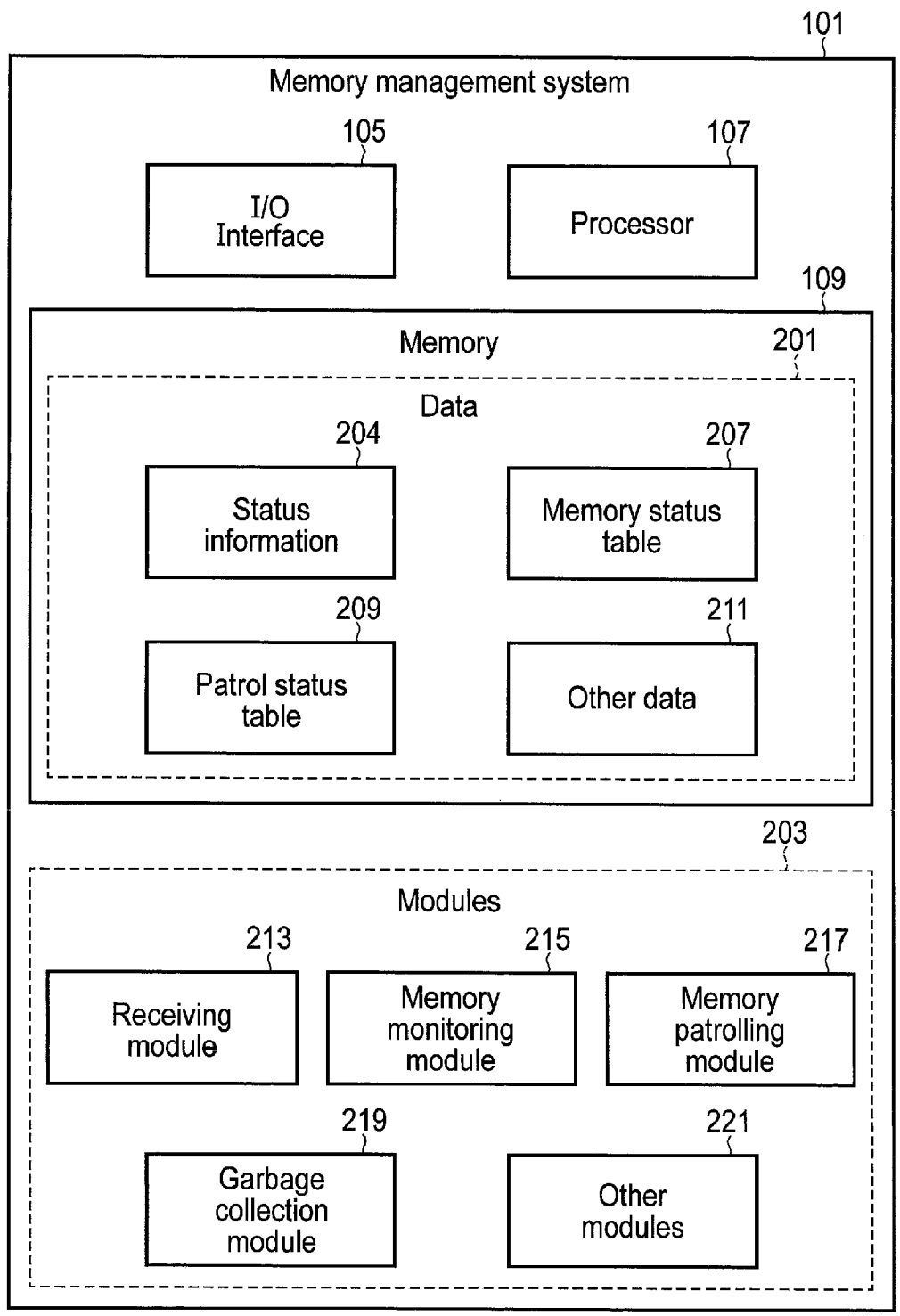
F I G. 2A

Part-I

Threshold values
PageInitCount=199(Read/Write operations)
PageTriggerCount=0
PagePatrolCount=0

{Valid page cnt
Patrol Status
Patrol Block}

(Blk N,Ers Cnt)

Patrol Status table 209 @PageInitCount=199

1. Target Block information
Patrol Block,PB=0xFF,
Valid Pages to patrol,VPC=0xFF,
Valid Page Bit(VPB)={0,0,0,0,0,0,0,0,0,0,0,0,0,0,0,0}|
Patrol Page Bit(PPB)={0,0,0,0,0,0,0,0,0,0,0,0,0,0,0,0}|
L2P Page Map(L2P)={0,0,0,0,0}

2. Patrol Status information
Patrol Block count(PBC)=0
Block Patrol Status Bit(BPSB)={0,0,0,0,0,0,0,0,0,0,}

Part-II

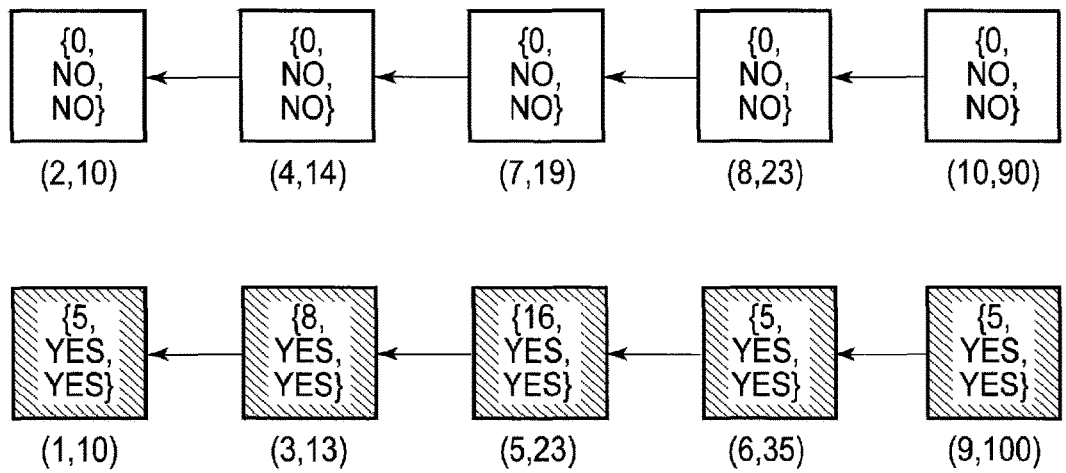

FIG. 3A

Part-I

Threshold values

PageInitCount=201(Read/Write operations)
PageTriggerCount=1
PagePatrolCount=0

Patrol Status table 209 @PageInitCount=201

1. Patrol Block information

Patrol Block,PB=9(highest erase count)
Valid Pages to patrol,VPC=5,
Valid Page Bit(VPB)={0,0,1,0,0,0,1,0,0,1,0,0,0,1,0,1}|
Patrol Page Bit(PPB)={0,0,1,0,0,0,1,0,0,1,0,0,0,1,0,1}|
L2P Page Map(L2P)={25,35,67,10,29}

2. Patrol Status information

Patrol Block count(PBC)=5
Block Patrol Status Bit(BPSB)={1,0,1,0,1,1,0,0,0,0,1,0}

Part-II

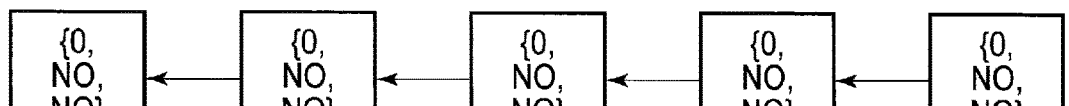

(2,10)　(4,14)　(7,19)　(8,23)　(10,90)

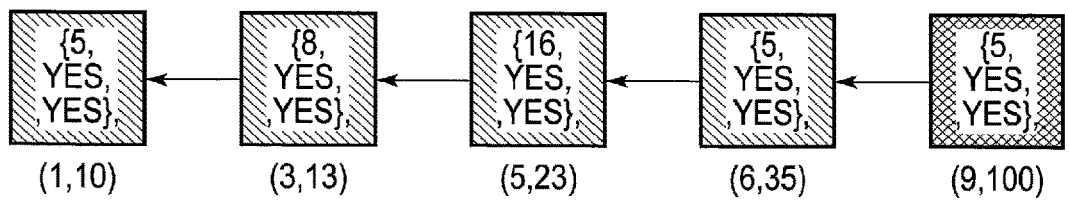

Part-I

Threshold values
PageInitCount=201(Read/Write operations)
PageTriggerCount=1
PagePatrolCount=1

Patrol Status table 209 @PageTriggerCount=200

1.Target Block information
Patrol Block,PB=9(highest erase count)
Valid Pages to patrol,VPC=2
Valid Page Bit(VPB)={0,0,1,0,0,0,1,0,0,1,0,0,0,1,0,1}|
Patrol Page Bit(PPB)={0,0,1,0,0,0,0,0,0,1,0,0,0,0,0,0}|
L2P Page Map(L2P)={25,0XFF,67,0XFF,0XFF}

2.Patrol Status information
Patrol Block count(PBC)=5
Block Patrol Status Bit(BPSB)={1,0,1,0,1,1,0,0,0,0,1,0}

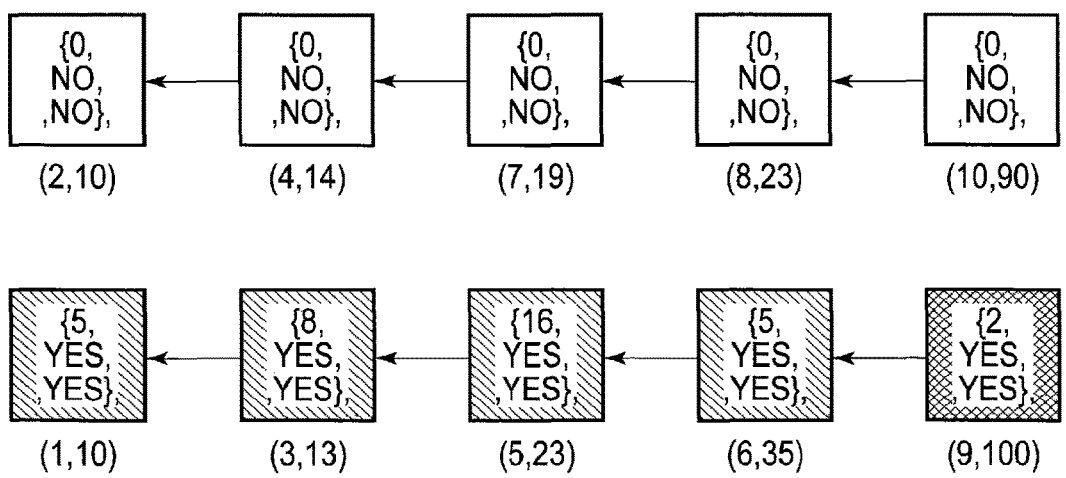

FIG. 3C

Part-I

Threshold values
PageInitCount=201(Read/Write operations)
PageTriggerCount=1
PagePatrolCount=0

Patrol Status table 209 @PageTriggerCount=200

1. Patrol Block information
Patrol Block,PB=9(highest erase count)
Valid Pages to patrol,VPC=0
Valid Page Bit(VPB)={0,0,1,0,0,0,1,0,0,1,0,0,0,1,0,1}|
Patrol Page Bit(PPB)={0,0,0,0,0,0,0,0,0,0,0,0,0,0,0,0}|
L2P Page Map(L2P)={0XFF,0XFF,0XFF,0XFF,0XFF}

2. Patrol Status information
Patrol Block count(PBC)=5
Block Patrol Status Bit(BPSB)={1,0,1,0,1,1,0,0,0,0,1,0}

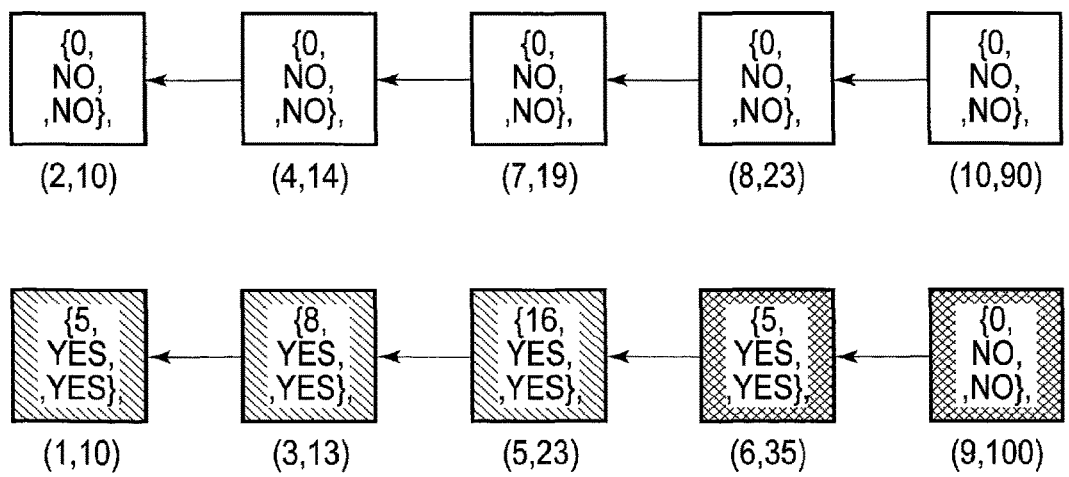

FIG. 3D

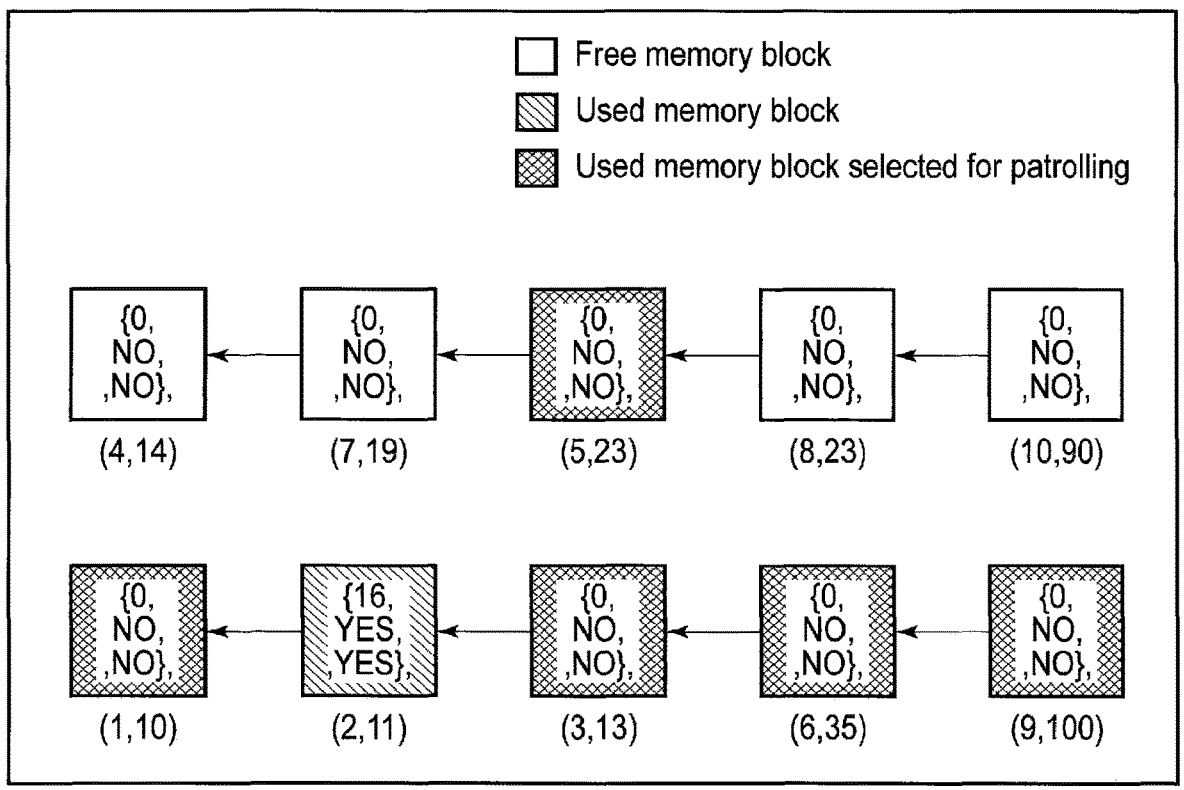
F I G. 3E

US 10,971,241 B2

PERFORMANCE BASED METHOD AND SYSTEM FOR PATROLLING READ DISTURB ERRORS IN A MEMORY UNIT

CROSS-REFERENCE TO RELATED APPLICATIONS

This application is based upon and claims the benefit of priority from Indian Patent Application No. 201741003371, filed Jan. 30, 2017, the entire contents of which are incorporated herein by reference.

FIELD

The present subject matter is related, in general to memory management, and more particularly, but not exclusively to a method and system for handling read disturb errors in a memory unit.

BACKGROUND

Memory patrolling or patrolling is a process of identifying correctable memory errors within a memory unit. One such correctable error that commonly persists in the memory units is Read Disturb errors in blocks of the memory unit. Patrolling through the blocks of the memory unit helps in identifying the read disturb errors in the blocks at specific intervals and performing a memory reclaim operation on the blocks.

The read disturb error is a type of error in a memory page, induced by read operations performed on the neighboring memory pages within a block of memory. When a memory page is read many times, it modifies the charge levels in the neighboring memory pages and causes the read disturbance error in those memory pages. Similarly, when a block of memory comprises multiple valid memory pages but is never read, it results in loss of charge in the memory pages over a period of time. Subsequently, when such memory pages are read from the block, it causes read disturb errors.

Generally, the read disturb errors are handled through the process of Garbage Collection (GC) or by performing block refresh. GC process involves copying the contents of the valid memory pages from the read-disturbed blocks into a free memory block and then moving the read-disturbed blocks into pool of free memory blocks. GC process is effective than block refreshing, which involves writing all the pages of the block to itself after successful erase.

The existing methods for identifying and handling the read disturb errors involve patrolling of all the memory blocks and all the memory pages, including the invalid pages, within each of the memory blocks in the memory unit. However, the existing methods do not evaluate all the system operations and memory blocks usage. This impacts the overall effectiveness of the patrolling process, i.e. process of identifying a block for patrolling and configuration of the patrolling process. Also, in the existing methods, the memory handling process (read/write throughput), consumes greater processor time and keeps the memory resources unavailable for a longer period. Hence, there is required an efficient method for handling the read disturb errors in the memory unit by considering the valid pages of the block, system block usage, performance configurations for patrolling process.

BRIEF DESCRIPTION OF THE DRAWING

The accompanying drawings, which are incorporated in and constitute a part of this disclosure, illustrate exemplary embodiments and, together with the description, serve to explain the disclosed principles. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which:

FIG. 2A shows a detailed block diagram illustrating a memory management system for handling the read disturb errors in the memory unit in accordance with some embodiments of the present disclosure;

FIG. 3A illustrate the process of initializing and patrolling a memory block in accordance with an exemplary embodiment of the present disclosure;

FIG. 33 illustrate the process of initializing and patrolling a memory block in accordance with an exemplary embodiment of the present disclosure;

FIG. 3C illustrate the process of initializing and patrolling a memory block in accordance with an exemplary embodiment of the present disclosure;

FIG. 3D illustrate the process of initializing and patrolling a memory block in accordance with an exemplary embodiment of the present disclosure;

FIG. 3E illustrate the process of initializing and patrolling a memory block in accordance with an exemplary embodiment of the present disclosure;

Figure 1:
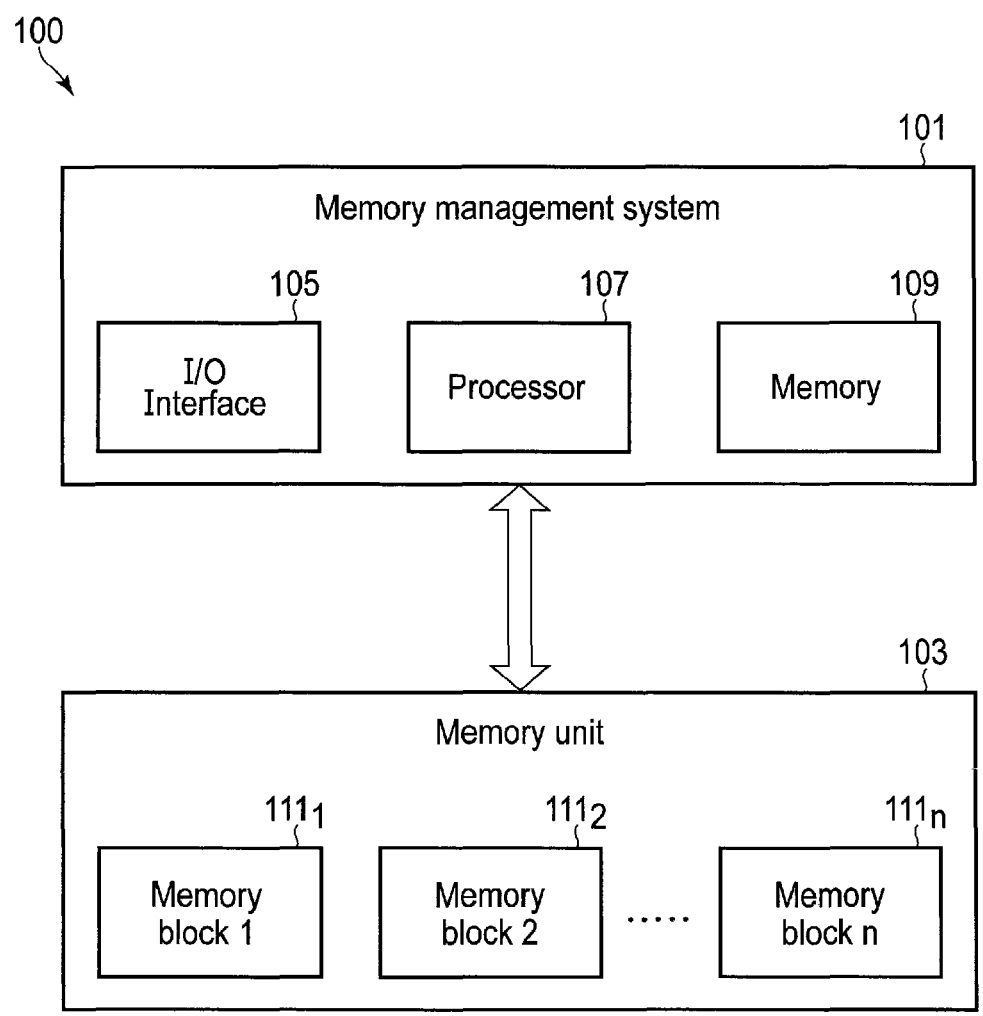
FIG. 1 shows an exemplary environment for handling read disturb errors in a memory unit in accordance with some embodiments of the present disclosure.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

Disclosed herein is a method for handling read disturb errors in a memory unit. The method comprises retrieving, a memory management system, status information related to each of plurality of memory blocks in the memory unit from a memory status table associated with the memory unit. The status information comprises block erase count and number of valid pages in each of the plurality of memory blocks.

Further, the method comprises identifying one or more target memory blocks with valid pages and having highest block erase count among the plurality of memory blocks. Upon identifying the one or more target memory blocks, each of one or more valid pages in the one or more target memory blocks are patrolled for identifying read disturb errors in the one or more valid pages. Finally, the one or more valid pages having the read disturb errors are recycled for handling the read disturb errors in the memory unit.

Further, the present disclosure relates to a memory management system for handling read disturb errors in a memory unit. The memory management system comprises a processor and a memory communicatively coupled to the processor. The memory stores processor-executable instructions, which, on execution, causes the processor to retrieve status information related to each of plurality of memory blocks in the memory unit from a memory status table associated with the memory unit. The status information comprises block erase count and number of valid pages in each of the plurality of memory blocks. Further, the processor identifies one or more target memory blocks with valid pages and having highest block erase count among the plurality of memory blocks. Furthermore, the processor patrols each of one or more valid pages in the one or more target memory blocks for identifying read disturb errors in the one or more valid pages. Finally, the processor recycles the one or more valid pages having the read disturb errors for handling the read disturb errors in the memory unit.

The foregoing summary is illustrative only and is not intended to be in any way limiting. In addition to the illustrative aspects, embodiments, and features described above, further aspects, embodiments, and features will become apparent by reference to the drawings and the following detailed description.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

The present disclosure relates to a method and a memory management system for handling read disturb errors in a memory unit. The method comprises retrieving, by a memory management system, status information related to each of plurality of memory blocks in the memory unit from a memory status table associated with the memory unit. The status information comprises block erase count and number of valid pages in each of the plurality of memory blocks. Further, the method comprises identifying one or more target memory blocks with valid pages and having highest block erase count among the plurality of memory blocks. Upon identifying the one or more target memory blocks, each of one or more valid pages in the one or more target memory blocks are patrolled for identifying read disturb errors in the one or more valid pages. Finally, the one or more valid pages having the read disturb errors are recycled for handling the read disturb errors in the memory unit.

Further, the method of the present disclosure comprises effectively patrolling the pages of the one or more target blocks by providing configuration for the patrolling process based on the system operations access pattern and count of the one or more valid pages to be patrolled at a particular instance. Also, the patrolling process is made more effective by constantly monitoring the memory status information of the memory unit with respect to the application read/write operations performed on the memory unit.

In an embodiment, the method and the memory management system of the present disclosure provide an effective method of patrolling of only the valid memory pages in a memory block, thereby reducing the time required for handling the read disturb errors in the memory block. Also, the method of the present disclosure ensures data retention reliability in the memory blocks by patrolling the memory block in the order of highest block erase counts. Further, the method disclosed herein allows a user to define a threshold value as a function of number of read-write operations performed on the memory block, wherein the patrolling process is dynamically initialized and executed based on the threshold value defined by the user.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

FIG. 1 shows an exemplary environment of a method for handling read disturb errors in a memory unit in accordance with some embodiments of the present disclosure.

Accordingly, the environment 100 comprises a memory management system 101 for handling read disturb errors in the memory unit 103. In an embodiment, the memory management system 101 comprises an I/O Interface 105, a processor 107 and a memory 109. The processor 107 causes the I/O interface 105 to interact with the memory unit 103 and retrieve status information 204 related to plurality of memory blocks 111 in the memory unit 103. The status information 204 and other related data retrieved from the memory unit 103 are stored in the memory 109 of the memory management system 101. As an example, the status information 204 retrieved from the memory unit 103 may comprise, without limiting to, block erase count and number of valid pages in the memory unit 103. In an embodiment, the memory management system 101 may be present outside the memory unit 103, as shown in FIG. 1. In some embodiments, the memory management system 101 may be configured within the memory unit 103.

The memory unit 103 may comprise the plurality of memory blocks, memory block 1 $111_1$ to memory block n $111_n$ (collectively referred as memory blocks 111). Further, each of the plurality of memory blocks 111 comprise one or more valid pages and one or more invalid pages. In an embodiment, the processor 107 identifies one or more target memory blocks among the plurality of memory blocks 111 in the memory unit 103, such that the one or more target memory blocks comprise valid pages and have a highest block erase count. Upon identifying the one or more target memory blocks, the processor 107 performs patrolling of each of one or more valid pages in the one or more target memory blocks for identifying the read disturb errors in the one or more valid pages of the one or more target memory blocks. Upon identifying the one or more valid pages having read disturb errors, the processor 107 performs recycling of each of the one or more valid pages having the read disturb errors, thereby effectively handling the read disturb errors in the memory unit 103. In some embodiment, the recycling involves copying the contents of the one or more valid pages into a free memory block and then moving the target memory block to a pool of free memory blocks.

FIG. 2A shows a detailed block diagram illustrating a memory management system in accordance with some embodiments of the present disclosure.

The memory management system 101 comprises an I/O interface 105, a processor 107 and a memory 109. The I/O interface 105 may be configured to receive the status information 204 of the plurality of memory blocks 111 from the memory unit 103. The memory 109 may be communicatively coupled to the processor 107. The processor 107 may be configured to perform one or more functions of the memory management system 101 for handling the read disturb errors in the memory unit 103. In one implementation, the memory management system 101 comprises data 201 and modules 203 for performing various operations in accordance with the embodiments of the present disclosure. In an embodiment, the data 201 may be stored within the memory 109 and may include, without limiting to, the status information 204, a memory status table 207, a patrol status table 209 and other data 211.

In one embodiment, the data 201 may be stored within the memory 109 in the form of various data structures. Additionally, the data 201 may be organized using data models, such as relational or hierarchical data models. The other data 211 may store data, including temporary data and temporary files generated by modules 203 for performing the various functions of the memory management system 101. Also, the other data 211 may include various data management tables required for performing the patrolling process.

In some embodiments, the status information 204 may comprise block erase count and number of valid pages in each of the plurality of memory blocks 111 of the memory unit 103. The block erase count of a memory page indicates the number of times for which the memory block has been erased. In some implementation, the status information 204 may be retrieved from the memory status table 207 in the memory unit 103.

In some embodiments, the memory status table 207 is associated with the memory unit 103 and comprises the status information 204 of the plurality of memory blocks 111 in the memory unit 103. Further, the memory status table 207 may also comprise memory address mapping data, target memory block count and number of valid pages to be patrolled in each of the one or more target memory blocks.

In some embodiments, the patrol status table 209 associated with the memory unit 103 stores status of patrolling of the plurality of memory blocks 111. The patrol status table 209 may comprise information related to the one or more valid pages pending for the patrolling. During patrolling, the memory management system 101 refers to the patrol status table 209 and performs the step of the patrolling until each of the one or more valid pages pending for the patrolling are patrolled. Further, the patrol status table 209 is updated at each iteration of the step of the patrolling.

In some embodiments, the data 201 may be processed by one or more modules 203 of the memory management system 101. In one implementation, the one or more modules 203 may be implemented as a part of the processor 107. In another implementation, the one or more modules 203 may be communicatively coupled to the processor 107 for performing one or more functions of the memory management system 101. The modules 203 may include, without limiting to, a receiving module 213, a memory monitoring module 215, a memory patrolling module 217, a garbage collection module 219 and other modules 221.

As used herein, in some implementations, the term module may refer to an application specific integrated circuit (ASIC), an electronic circuit, a processor (shared, dedicated, or group) and memory that execute one or more software or firmware programs, a combinational logic circuit, and/or other suitable components that provide the described functionality. In an embodiment, the other modules 221 may be used to perform various miscellaneous functionalities of the memory management system 101. It will be appreciated that such modules 203 may be represented as a single module or a combination of different modules.

In some embodiments, the receiving module 213 may be responsible for retrieving the status information 204 related to each of plurality of memory blocks 111 in the memory unit 103. The status information 204 may be retrieved from the memory status table 207 associated with the memory unit 103. As an example, the status information 204 may comprise, without limiting to, block erase count and number of valid pages in each of the plurality of memory blocks 111. In some embodiment, the receiving module 213 retrieves an updated status information 204 from the memory status table 207 before initializing and starting execution of the patrolling of the plurality of memory blocks 111 during successive iterations of the step of the patrolling.

In some embodiments, the memory monitoring module 215 may be responsible for monitoring each of the plurality of memory blocks 111 based on the status information 204 associated with each of the plurality of memory blocks 111 to identify one or more target memory blocks among the plurality of memory blocks 111. The memory monitoring module 215 identifies the one or more target memory blocks based on the block erase count and the presence of valid pages in the plurality of memory blocks 111. As an example, the one or more target memory blocks are the memory blocks comprising valid pages and having the highest block erase count among the plurality of memory blocks 111. In some embodiments, the memory monitoring module 215 may be responsible for monitoring movement of the plurality of memory blocks 111 into the pool of free memory blocks, thus, keeping a track of the status of each of the plurality of memory blocks 111.

In an embodiment, the memory patrolling module 217 may be responsible for patrolling each of the one or more valid pages in each of the one or more target memory blocks. By patrolling the one or more target memory blocks, the memory patrolling module 217 identifies the one or more valid pages having the read disturb errors. In some implementations, the memory patrolling module 217 may be initialized when the number of read-write memory operations performed on the one or more valid pages is higher than at least one of a first predetermined threshold value or a user defined value in real time. As an example, the first predetermined threshold value may be 200 read-write memory operations. In that case, the memory patrolling module 217 may be initialized as soon as the number of read-write memory operations on the one or more valid pages reaches 200.

In some embodiments, the memory patrolling module 217 may store the status of the patrolling in the patrol status table 209. The patrol status table 209 comprises information related to the one or more valid pages pending for the patrolling. Further, the memory patrolling module 217 may update the patrol status table 209 upon completion of each iteration of the patrolling.

In an embodiment, the garbage collection module 219 may be responsible for recycling the one or more valid pages having the read disturb errors. During recycling of the one or more valid pages, the garbage collection module 219 may copy the contents of the one or more valid pages into a free memory block in the memory unit 103. Subsequently, the garbage collection module 219 may move the one or more target memory blocks into a pool of free memory blocks, comprising the one or more free memory blocks, upon completion of recycling of each of the one or more valid pages.

In some embodiments, the garbage collection module 219 may be configured with a generic garbage collection mechanism, wherein the garbage collection module 219 recycles a memory block by copying each of the one or more valid pages into a free memory block and then moving the recycled memory block to the pool of free memory blocks. Further, once the read disturb errors are identified during the patrolling process, the garbage collection module 219 may perform the above said generic garbage collection mechanism to recycle the memory block having the read disturb errors.

Furthermore, the memory block which is already recycled by the garbage collection module 219 may not to be patrolled. In other words, if the garbage collection module 219 has already recycled the one or more target memory blocks, which have been marked to be patrolled, due to any system operation, then the one or more target memory blocks are not required to patrolled. Hence, the count of the one or more target memory blocks which are marked for patrolling would be reduced, thereby reducing the overall time of execution of the patrolling.

Figure 2B:
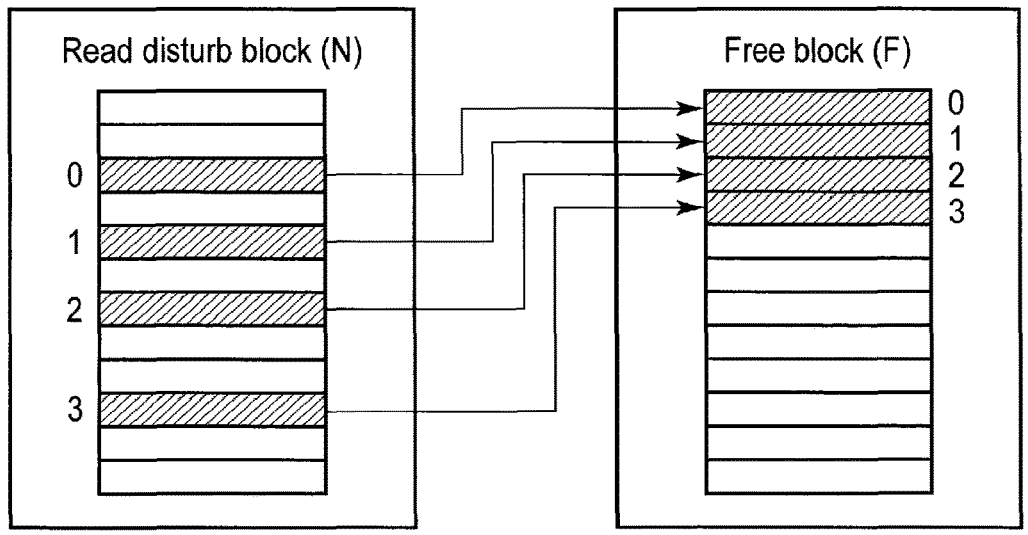
FIG. 2B is an exemplary representation of a memory block having read disturb errors and a method thereof for handling the read disturb errors in the memory block in accordance with some embodiments of the present disclosure.
Figure 2B:
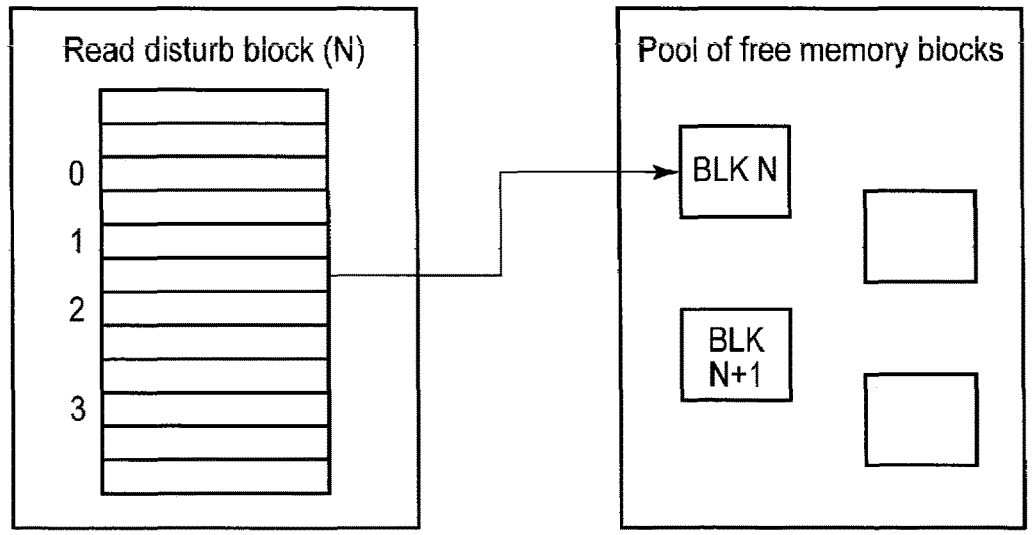

The process of recycling the one or more valid pages having the read disturb errors may be illustrated with the help of FIG. 2B. As indicated in Step 1 of FIG. 2B, initially, the garbage collection module 219 comprises copying the contents of each of the one or more valid pages in a read disturb block (N) into a free block (F). As an example, there may be 4 valid pages in the read disturb block (N), which are indicated by numerals 0, 1, 2 and 3 in FIG. 2B, which are subsequently copied to the free block (F) in a sequential manner.

In an embodiment, the read disturb block (N) may be empty once each of the one or more valid pages in the read disturb block (N) have been copied to the free memory block (F). Further, as indicated in Step 2 of FIG. 2B, the garbage collection module 219 moves the read disturb block (N), which is now empty, into the free memory block pool, thereby effectively handling the read disturb block (N).

Figure 2C:
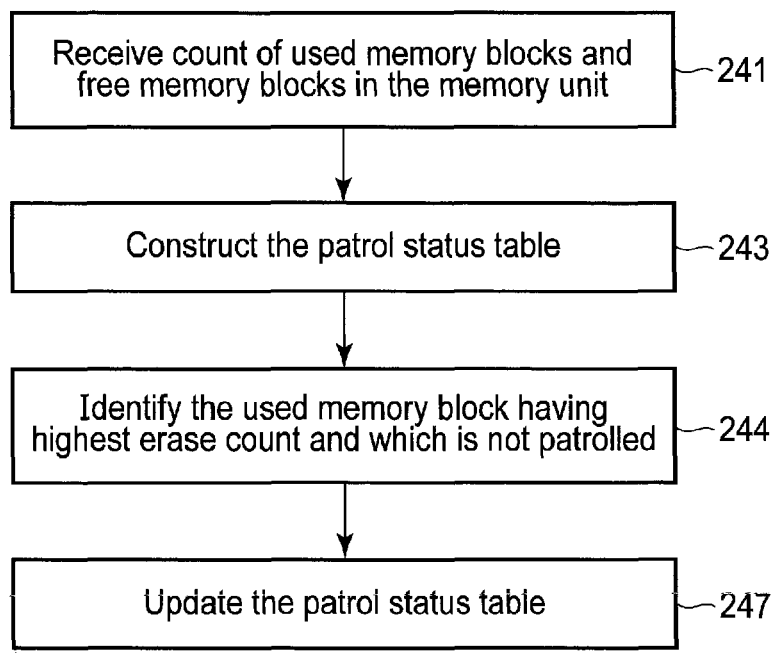
FIG. 2C shows a flowchart illustrating initialization of patrolling of a memory block in accordance with some embodiments of the present disclosure.

FIG. 2C shows a flowchart illustrating initialization of the patrolling of the plurality of memory blocks in accordance with some embodiments of the present disclosure.

At step 241, the memory management system 101 receives a count of the used memory blocks and free memory blocks among the plurality of memory blocks 111 in the memory unit 103. The used memory block may comprise one or more valid pages, which in turn comprise some valid data. On the other hand, the free memory block may not comprise valid pages and may be marked as 'erased'. At step 243, the memory management system 101 constructs the patrol status table 209, wherein the patrol status table 209, when initialized, may comprise information related to the number of invalid pages and the number of valid pages in the plurality of memory blocks 111, which are not patrolled. At step 245, the memory management system 101 identifies the one or more used memory blocks comprising valid pages and having highest block erase count, which are pending for patrolling. In an embodiment, the one or more used memory blocks which are identified in step 243 are the one or more target memory blocks that must be patrolled. Further, at step 247, the memory management system 101 further updates the patrol status table 209 which comprises information related to the one or more valid pages pending for the patrolling.

Figure 2D:
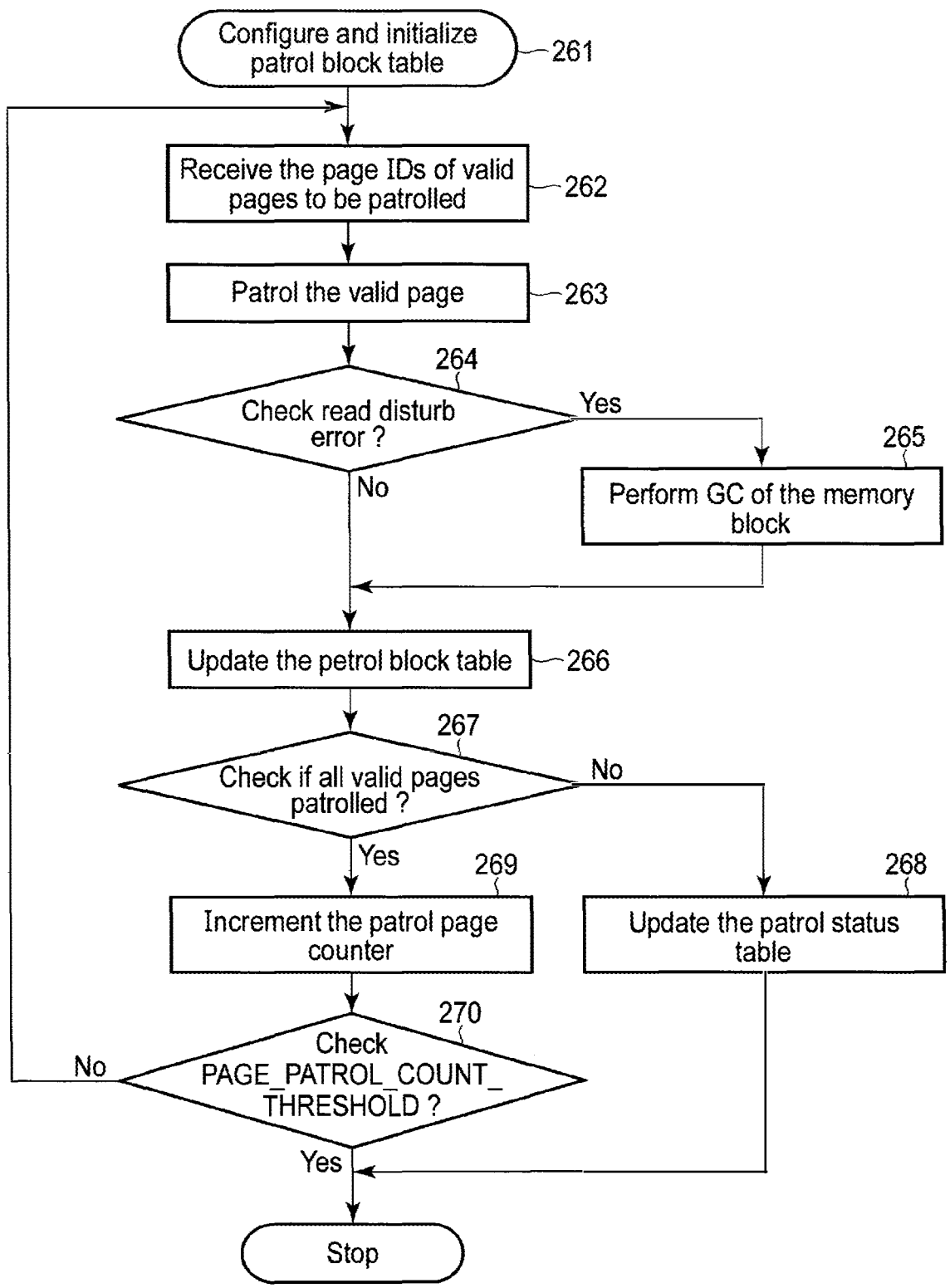
FIG. 2D shows a flowchart illustrating process of patrolling of a memory block in accordance with some embodiments of the present disclosure.

FIG. 2D shows a flowchart illustrating the execution of patrolling of the memory block in accordance with some embodiments of the present disclosure.

At step 261, the memory management system 101 involves configuration and initialization of patrolling of the plurality of memory blocks 111. The patrolling may be configured and initialized based on the following criteria:

1. Patrol Initialization Threshold:
(PATROL_TABLE_INIT_THRESHOLD)

In an embodiment, the patrolling is initialized when number of read-write memory operations performed on the one or more valid pages of the one or more target memory blocks is higher than the first predetermined threshold value. As an example, the first predetermined threshold value may be 200 read-write memory operations. In an implementation, a global counter value may be incremented based on the read-write memory operations performed on the memory unit 103, and is constantly checked against the first predetermined threshold value.

The global counter value may be incremented when the number of target memory blocks pending for patrolling (i.e. patrol block count) is zero. Further, the total time taken by the memory management system 101 for patrolling each of the one or more target memory blocks, upon initialization of the patrolling is considered as Patrol Algorithmic Cycle (PAC).

2. Patrol Trigger Threshold:
(PATROL_TRIGGER_THRESHOLD)

Patrol trigger threshold is the threshold value count available for the user to trigger the patrolling of the plurality of memory blocks 111 based on the count of page read-write memory operations. Like in the case of the first predetermined threshold value, a global counter value may be incremented based on the read-write memory operation. Further, the global counter may be constantly checked against the threshold value to trigger the patrolling. In an embodiment, the time between two patrol triggers is considered as Patrol Execution Cycle (PEC).

3. Patrol Page/Block Threshold Value:
(PAGE_PATROL_COUNT_THRESHOLD)

Patrol page or patrol block threshold value is the threshold value count available for the user to set the number of valid pages to be patrolled when the patrolling is triggered and initialized. A global counter value may be incremented based on the number of pages patrolled. Further, the global counter may be constantly checked against this threshold value to complete the patrol execution process. In an embodiment, the time taken by the memory management system 101 to patrol each of the one or more target memory blocks is called Patrol Block Cycle (PBC).

Upon configuring and initializing the patrolling process, at step 262, the memory management system 101 may refer to the memory status table 20% to identify the one or more valid pages to be patrolled, based on the IDs and/or the memory address associated with each of the one or more valid pages. Upon identifying the one or more valid pages for patrolling, the identified one or more valid pages are patrolled in step 263. By patrolling through each of the one or more valid pages, the one or more valid pages having read disturb errors are identified in step 264. If there is a read disturb error in the one or more valid pages, then the memory management system 101 invokes recycling of the one or more valid pages using the process of Garbage Collection as indicated in step 265. In step 266, the memory management system 101 updates the patrol status table 209 (as shown in FIG. 3A) after the step of recycling or when there is no read disturb error in the one or more valid pages.

In step 267, the memory management system 101 checks whether each of the one or more valid pages have been patrolled or not, using the updated information in the patrol block table. If there are no valid pages pending for patrolling, at step 268, the memory management system 101 updates the patrol status table 209 accordingly and the patrolling is marked to be completed. On the other hand, if there are any valid pages pending for patrolling, the memory management system 101 increments the patrol counter at step 269 and checks whether the PAGE_PATROL_COUNT_ THRESHOLD value has been reached as indicated in step 270. In an embodiment, if the PAGE_PATROL_ COUNT_ THRESHOLD has been reached, the memory management system 101 stops the process of patrolling. However, if the PAGE_PATROL_COUNT_ THRESHOLD has not been reached yet, the patrolling is resumed from step 262 by collecting the memory address of a next valid page pending for patrolling.

In some embodiments, the memory management system 101 may monitor movement of the plurality of memory blocks 111 to the pool of free memory blocks and one or more memory read and write operations performed on the plurality of memory blocks 111. If one or more of the plurality of memory blocks 111 are moved to the pool of free memory blocks based on any condition or resultant to one or more system operations, then the patrolling status of the one or more of the plurality of blocks may be set as patrolled. In other words, the memory management system 101 may not consider the one or more of the plurality of memory blocks 111, which are already moved to the pool of free memory blocks, for patrolling, thereby reducing the time of execution of the PAC.

Further, the one or more valid pages within the one or more target memory blocks, which are being read and/or written by an application running in the memory management system 101 may be excluded for patrolling. For example, if the one or more valid pages which are being read by the application are present within one of the one or more target memory blocks pending to be patrolled, then the status of patrolling of those valid pages may be set as patrolled since the application itself would patrol the one or more valid pages being read by it. Similarly, if the one or more valid pages have a mapping in one of the one or more target memory blocks pending for patrolling, then those valid pages need not be patrolled. Instead, the data stored in the one or more valid pages are remapped to a free memory block, thereby avoiding the necessity of patrolling. The above scenarios would also reduce the overall time of execution of the PBC.

FIGS. 3A-3E illustrate an exemplary embodiment of memory management system 101 for handling the read disturb errors in the memory unit 103.

FIG. 3A indicates status of the one or more target memory blocks and state information of the patrol status table 209 and various predetermined threshold values. For explanation, 10 target memory blocks are considered in this example. Each block in Part II of FIG. 3A represents a target memory block and indicates the number of valid pages in the target memory block, the status of patrolling of the target memory block and whether the target memory block will be patrolled in the current iteration of the patrolling. Further, the label (within parenthesis) associated with each of the one or more target memory blocks represents the target memory block sequence number and the block erase count of the target memory block respectively. As an example, the first target memory block, target memory block—1 (labelled as 1 within the parenthesis) comprises 5 valid pages to be patrolled and the status of the patrolling is set as "YES", which means that the target memory block—1 must be patrolled. Also, the patrol block status of the target memory block—1 is set as "YES" which means that the target memory block—1 will be taken up for the patrolling in the current iteration of the patrolling.

Further, Part I of FIG. 3A indicates the threshold values, namely the 'PageInitCount', the 'PageTriggerCount' and the 'PagePatrolCount'. These are the threshold values to be considered during initialization and execution of patrolling. The 'PageInitCount' corresponds to the 'PATROL_TABLE_ INIT_THRESHOLD' parameter and indicates the predetermined threshold value for initializing the patrolling based on the number of read-write memory operations. As an example, the 'PageInitCount' may be set as 200, which means that the patrolling will be initialized when the total number of read-write operations crosses 200. Further, the 'PageTriggerCount' corresponds to the 'PAGE_PATROL_ COUNT_THRESHOLD' value and indicates the threshold value count available for the user to trigger the patrolling of the plurality of memory blocks 111 based on the count of page read-write memory operations. Further, the 'PagePatrolCount' corresponds to the 'PAGE_PATROL_COUNT_ THRESHOLD' value and indicates the threshold value count available for the user to set the number of valid pages to be patrolled when the patrolling is triggered and initialized.

The patrol status table 209 comprises information related to each of the one or more target memory blocks and the information related to the status of patrolling of each of the one or more target memory blocks. As an example, the target block information in the patrol status table 209 may include, without limiting to, a unique memory address of the target memory block (Patrol block), number of valid pages pending to be patrolled in the target memory block (VPC), a valid page status bit (VPB) indicating the one or more valid pages in the target memory block, a patrol page bit (PPB) indicating the status of patrolling of the one or more valid pages and a Logical-to-Physical memory address mapping information (L2P) of the target memory block.

Further, the patrol status information 204 stored in the patrol table may include, without limiting to, a patrol block count bit (PBC) indicating the number of target memory blocks patrolled by the memory management system 101 and a block patrol status bit (BPSB) indicating the status of patrolling of the target memory block. As an example, the BPSB is set to '1' when the target memory block has been patrolled.

FIG. 3B indicates the status of patrolling when the 'PageInitCount' has crossed the predetermined 'PageInitCount' threshold value, i.e., 200. Now, the memory management system 101 identifies one of the one or more target memory blocks to be patrolled in the current iteration of patrolling based on the block erase count corresponding to the one or more target memory blocks. In the instant example, the target memory block—9 is selected for patrolling, since the target memory block—9 has highest block erase count i.e., 100 and 5 valid pages. Also, the VPB corresponding to the target memory block—9 is updated to indicate the sequence of valid pages within the target memory block—9. As shown in FIG. 3B, the status of bits in the VPB which correspond to the sequence of valid pages are set to '1'. Similarly, the PPB corresponding to the target memory block—9 indicates the status of patrolling of each of the valid pages in the target memory block—9. Further, the L2P field corresponding to the target memory block—9 stores the Logical-to-Physical memory addresses for each of the valid pages in the target memory block—9.

In some embodiments, as shown in FIG. 3C, when the number of pages to be patrolled in one iteration of patrolling is set to value '3', only 3 valid pages of the target memory block are patrolled in each iteration of the patrolling. Hence, in the given example, upon completion of the first iteration of the patrolling of the target memory block—9, there will be 2 valid pages pending for patrolling in the target memory block—9. Accordingly, status of the VPB and PPB are updated based on each iteration of the patrolling, until each of the one or more valid pages in the target memory block—9 are patrolled.

FIG. 3D shows the status of the patrol status table 209 after the target memory block—9 is completely patrolled. The VPC field corresponding to the target memory block—9 is reset to '0' indicating that there are no valid pages pending for the patrolling. Further, each bit in the VPB and the PPB is reset to '0' indicating that the patrolling of the target memory block—9 is complete. Also, the L2P fields are reset to a default memory address. Finally, in the BPSB, the status bit corresponding to the status of patrolling of the target memory block—9 is reset to '0', indicating that the patrolling is complete. Thereafter, the memory management system 101 selects one of the one or more target memory block comprising valid pages and having highest block erase count as the next target memory block based on the procedure illustrated in FIGS. 3A-3D. Finally, FIG. 3E indicates change in status of the one or more target memory blocks upon completion of the patrolling of each of the one or more target memory blocks.

Figure 4:
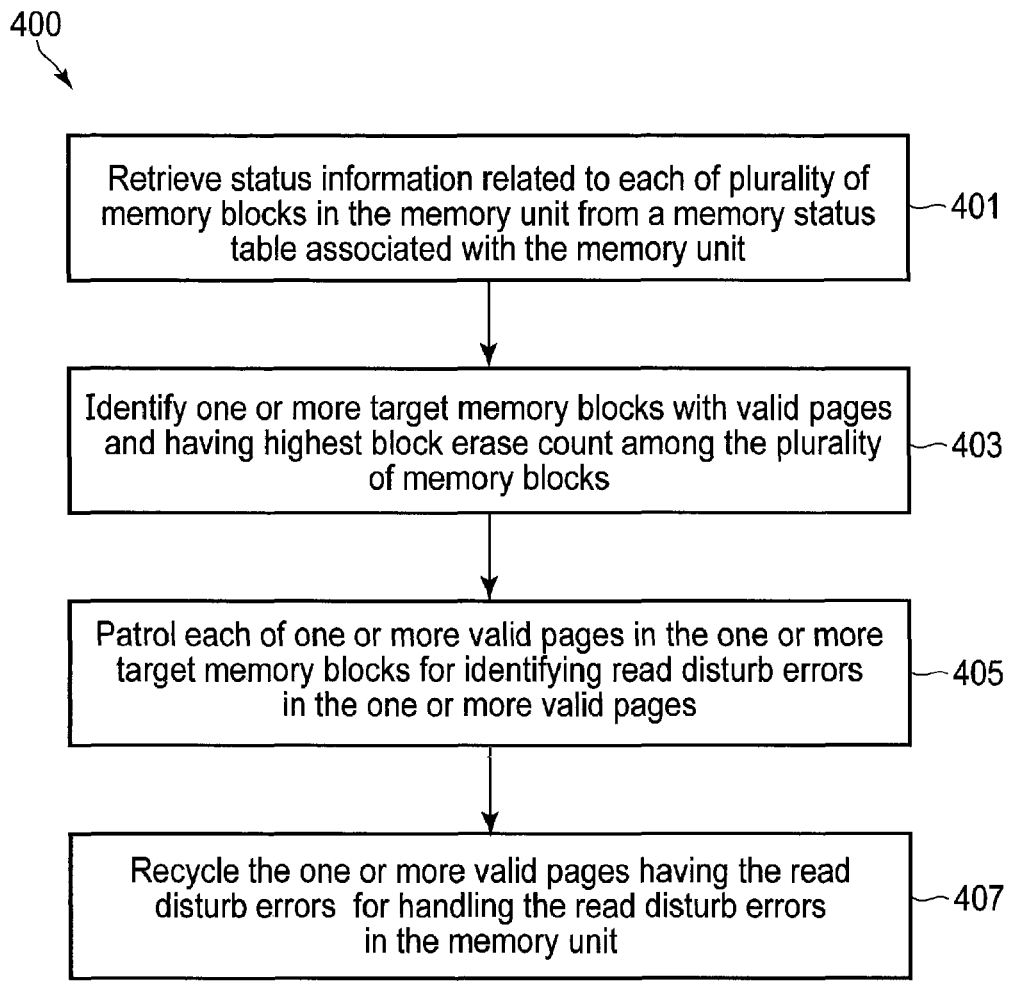
FIG. 4 shows a flowchart illustrating a method for handling read disturb errors in a memory unit in accordance with some embodiments of the present disclosure.

FIG. 4 shows a flowchart illustrating a method for handling read disturb errors in a memory unit in accordance with some embodiments of the present disclosure.

As illustrated in FIG. 4, the method 400 comprises one or more blocks for handling the read disturb errors in the memory unit 103 using the memory management system 101. The method 400 may be described in the general context of computer executable instructions. Generally, computer executable instructions can include routines, programs, objects, components, data structures, procedures, modules, and functions, which perform specific functionalities or implement specific abstract data types.

The order in which the method 400 is described is not intended to be construed as a limitation, and any number of the described method blocks can be combined in any order to implement the method. Additionally, individual blocks may be deleted from the methods without departing from the spirit and scope of the subject matter described herein. Furthermore, the method can be implemented in any suitable hardware, software, firmware, or combination thereof.

At block 401, the memory management system 101 retrieves status information 204 related to each of plurality of memory blocks 111 in the memory unit 103 from a memory status table 207 associated with the memory unit 103. The status information 204 comprises block erase count and number of valid pages in each of the plurality of memory blocks 111. In an embodiment, the memory status table 207 may further comprise memory address mapping data, target memory block count and number of valid pages to be patrolled in each of the one or more target memory blocks.

At block 403, the memory management system 101 identifies one or more target memory blocks with valid pages and having highest block erase count among the plurality of memory blocks 111. The one or more target memory blocks are the memory blocks that need to be patrolled and recycled. In some embodiments, the status of the patrolling of one or more of the plurality of memory blocks 111 is set as patrolled when the one or more of the plurality of memory blocks 111 are moved into a free memory block pool, comprising one or more free memory blocks, based on one or more system operations. Hence, these memory blocks may not be considered for patrolling. Further, the status of the patrolling of one or more of the plurality of memory blocks 111 is set as patrolled when the one or more of the plurality of memory blocks 111 are being used by an application running on the memory management system during the patrolling of the one or more of the plurality of memory blocks 111. Hence, these memory blocks also may not be considered for the patrolling.

At block 405, the memory management system 101 patrols each of one or more valid pages in the one or more target memory blocks for identifying read disturb errors in the one or more valid pages. In an embodiment, the patrolling is initialized when number of read-write memory operations performed on the one or more valid pages is higher than at least one of a first predetermined threshold value or a user defined value in real-time. Further, the status of the patrolling is stored in a patrol status table 209 in the memory unit 103, wherein the patrol status table 209 comprises information related to the one or more valid pages pending for the patrolling. The patrol status table 209 may be updated at each iteration of the step of the patrolling.

In an embodiment, the memory management system 101 further comprises iteratively performing step of the patrolling until each of the one or more valid pages pending for the patrolling are patrolled. In some implementation, the number of target memory blocks to be patrolled in an iteration is based on a second predetermined threshold value.

At block 407, the memory management system 101 recycles the one or more valid pages having the read disturb errors for handling the read disturb errors in the memory unit 103. In an embodiment, the recycling comprises copying contents of the one or more valid pages into a free memory block in the memory unit 103. Further, the memory management system 101 comprises moving the one or more target memory blocks into free memory block pool comprising one or more free memory blocks upon completion of the recycling of the one or more valid pages. Finally, the memory management system 101 updates the memory status table 207 upon completion of the recycling.

Computer System

Figure 5:
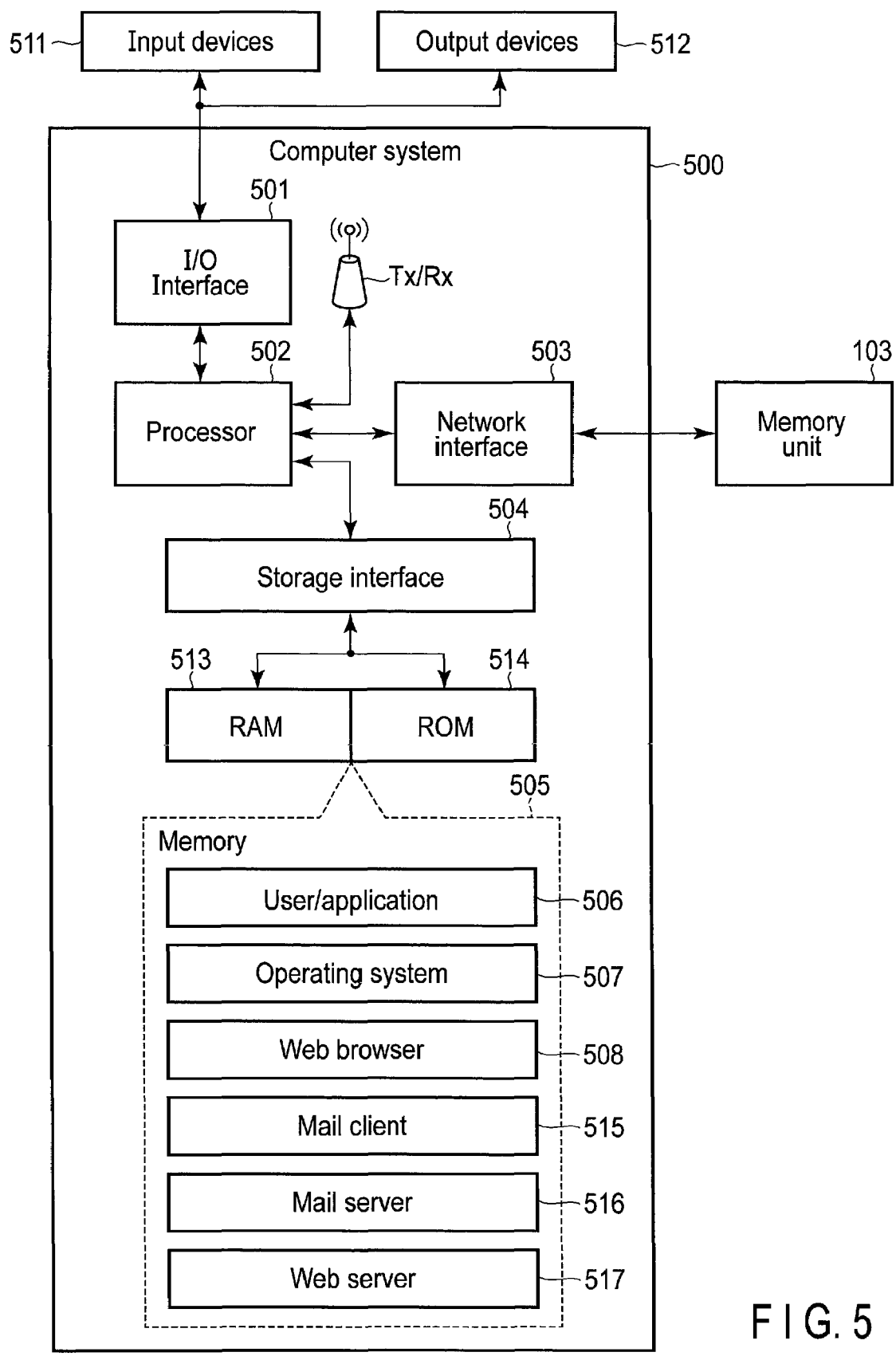
FIG. 5 illustrates a block diagram of an exemplary computer system for implementing embodiments consistent with the present disclosure.

FIG. 5 illustrates a block diagram of an exemplary computer system 500 for implementing embodiments consistent with the present invention. In an embodiment, the computer system 500 may be the memory management system 101 which is used for handling the read disturb errors in the memory unit 103. The computer system 500 may comprise a central processing unit ("CPU" or "processor") 502. The processor 502 may comprise at least one data processor for executing program components for executing user- or system-generated business processes. A user may include a person, a person using a device such as such as those included in this invention, or such a device itself. The processor 502 may include specialized processing units such as integrated system (bus) controllers, memory management control units, floating point units, graphics processing units, digital signal processing units, etc.

The processor 502 may be disposed in communication with one or more input/output (I/O) devices (511 and 512) via I/O interface 501. The I/O interface 501 may employ communication protocols/methods such as, without limitation, audio, analog, digital, stereo, IEEE-1394, serial bus, Universal Serial Bus (USB), infrared, PS/2, BNC, coaxial, component, composite, Digital Visual Interface (DVI), high-definition multimedia interface (HDMI), Radio Frequency (RF) antennas, S-Video, Video Graphics Array (VGA), IEEE 802.n/b/g/n/x, Bluetooth, cellular (e.g., Code-Division Multiple Access (CDMA), High-Speed Packet Access (HSPA+), Global System For Mobile Communications (GSM), Long-Term Evolution (LTE) or the like), etc. Using the I/O interface 501, the computer system 500 may communicate with one or more I/O devices (511 and 512).

In some embodiments, the processor 502 may be disposed in communication with the memory unit 103 via a network interface 503. The network interface 503 may employ connection protocols including, without limitation, direct connect, Ethernet (e.g., twisted pair 10/100/1000 Base T), Transmission Control Protocol/Internet Protocol (TCP/IP), token ring, IEEE 802.11a/b/g/n/x, etc. Using the network interface 503, the computer system 500 may communicate with the memory unit 103 for identifying and handling the read disturb errors in the memory unit 103.

In some embodiments, the processor 502 may be disposed in communication with a memory 505 (e.g., RAM 513, ROM 514, etc. as shown in FIG. 5) via a storage interface 504. The storage interface 504 may connect to memory 505 including, without limitation, memory drives, removable disc drives, etc., employing connection protocols such as Serial Advanced Technology Attachment (SATA), Integrated Drive Electronics (IDE), IEEE-1394, Universal Serial Bus (USB), fiber channel, Small Computer Systems Interface (SCSI), etc. The memory drives may further include a drum, magnetic disc drive, magneto-optical drive, optical drive, Redundant Array of Independent Discs (RAID), solid-state memory devices, solid-state drives, etc.

The memory 505 may store a collection of program or database components, including, without limitation, user/application data 506, an operating system 507, web server 508 etc. In some embodiments, computer system 500 may store user/application data 506, such as the data, variables, records, etc. as described in this invention. Such databases may be implemented as fault-tolerant, relational, scalable, secure databases such as Oracle or Sybase.

The operating system 507 may facilitate resource management and operation of the computer system 500. Examples of operating systems include, without limitation, Apple Macintosh OS X, UNIX, Unix-like system distributions (e.g., Berkeley Software Distribution (BSD), FreeBSD, Net BSD, Open BSD, etc.), Linux distributions (e.g., Red Hat, Ubuntu, K-Ubuntu, etc.), International Business Machines (IBM) OS/2, Microsoft Windows (XP, Vista/7/8, etc.), Apple iOS, Google Android, Blackberry Operating System (OS), or the like. A user interface may facilitate display, execution, interaction, manipulation, or operation of program components through textual or graphical facilities. For example, user interfaces may provide computer interaction interface elements on a display system operatively connected to the computer system 500, such as cursors, icons, check boxes, menus, windows, widgets, etc. Graphical User Interfaces (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, JavaScript, AJAX, HTML, Adobe Flash, etc.), or the like.

In some embodiments, the computer system 500 may implement a web browser 508 stored program component. The web browser may be a hypertext viewing application, such as Microsoft Internet Explorer, Google Chrome, Mozilla Firefox, Apple Safari, etc. Secure web browsing may be provided using Secure Hypertext Transport Protocol (HTTPS) secure sockets layer (SSL), Transport Layer Security (TLS), etc. Web browsers may utilize facilities such as AJAX, DHTML, Adobe Flash, JavaScript, Java, Application Programming Interfaces (APIs), etc. In some embodiments, the computer system 500 may implement a mail server stored program component. The mail server may be an Internet mail server such as Microsoft Exchange, or the like. The mail server may utilize facilities such as Active Server Pages (ASP), ActiveX, American National Standards Institute (ANSI) C++/C #, Microsoft .NET, CGI scripts, Java, JavaScript, PERL, PHP, Python, WebObjects, etc. The mail server may utilize communication protocols such as Internet Message Access Protocol (IMAP), Messaging Application Programming Interface (MAPI), Microsoft Exchange, Post Office Protocol (POP), Simple Mail Transfer Protocol (SMTP), or the like. In some embodiments, the computer system 500 may implement a mail client stored program component. The mail client may be a mail viewing application, such as Apple Mail, Microsoft Entourage, Microsoft Outlook, Mozilla Thunderbird, etc.

Furthermore, one or more computer-readable storage media may be utilized in implementing embodiments consistent with the present invention. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., non-transitory. Examples include Random Access Memory (RAM), Read-Only Memory (ROM), volatile memory, nonvolatile memory, hard drives, Compact Disc (CD) ROMs, Digital Video Disc (DVDs), flash drives, disks, and any other known physical storage media.

Advantages of the embodiment of the present disclosure are illustrated herein.

In an embodiment, the present disclosure provides a method for identifying and handling the read disturb errors in a memory unit.

In an embodiment, the present disclosure discloses an effective method of patrolling of only the valid memory pages in a memory block, thereby reducing the time required for handling the read disturb errors in the memory block.

In an embodiment, the method of present disclosure ensures high data retention reliability in the memory blocks by patrolling the memory block in the order of highest block erase counts.

In an embodiment, the method of present disclosure allows a user to dynamically configure when the patrolling must initialize and start execution by defining a threshold value as a function of number of read-write operations performed on a memory block.

In an embodiment, the patrolling table design disclosed in the present disclosure is capable of monitoring and managing a complete NAND flash data and device management tables.

In an embodiment, according to the method of the present disclosure, the one or more valid memory pages are considered to be patrolled if they are used by an application running in the system, thereby reducing the overall time of execution of the patrolling.

In an embodiment, the patrol status table, configured to store the information related to the patrolling, has a very limited size (in the range of bits) which results in a compact patrol design.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise. A description of an embodiment with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for handling read disturb errors in a memory, the method comprising:

retrieving, by a memory management system, status information related to each of a plurality of memory blocks in the memory from a memory status table associated with the memory, wherein the status information includes a block erase count and a number of one or more valid pages in each of the plurality of memory blocks;

identifying, by the memory management system, one or more target memory blocks with the one or more valid pages and having a highest block erase count among the plurality of memory blocks;

patrolling, by the memory management system, each of the one or more valid pages in the one or more target memory blocks for identifying the read disturb errors in the one or more valid pages, wherein at least three different threshold counters are considered during initialization and execution of the patrolling, (1) a first threshold counter corresponding to a first predetermined threshold value for initializing the patrolling based on a number of read-write memory operations, (2) a second threshold counter corresponding to a second predetermined threshold value for a user to trigger the patrolling based on a count of page read-write memory operations, and (3) a third threshold counter corresponding to a third predetermined threshold value for the user to set a number of valid pages to be patrolled when the patrolling is triggered and initialized; and recycling, by the memory management system, the one or more valid pages having the read disturb errors for handling the read disturb errors in the memory, wherein a status of patrolling of one or more of the plurality of memory blocks is set as patrolled when the one or more of the plurality of memory blocks are being used by an application running on the memory management system during the patrolling of the one or more of the plurality of memory blocks, and the status of the patrolling is stored in a patrol status table in the memory, wherein the patrol status table includes information related to the one or more valid pages which are not patrolled and target block information including at least a memory address of the one or more target memory blocks and a number of the one or more valid pages pending to be patrolled in the one or more target memory blocks.

2. The method as claimed in claim 1, wherein the memory status table further comprises memory address mapping data, a target memory block count, and the number of one or more valid pages to be patrolled in each of the one or more target memory blocks.

3. The method as claimed in claim 1, wherein the patrolling is initialized when the number of read-write memory operations performed on the one or more valid pages is higher than at least one of the first predetermined threshold value or a user defined value in real-time.

4. The method as claimed in claim 1, wherein the status of patrolling of one or more of the plurality of memory blocks is set as patrolled when the one or more of the plurality of memory blocks are moved into a free memory block pool, the free memory block pool including one or more free memory blocks, based on one or more system operations.

5. The method as claimed in claim 1 further comprises iteratively performing step of the patrolling until each of the one or more valid pages which are not patrolled are patrolled.

6. The method as claimed in claim 3, wherein a number of the one or more target memory blocks to be patrolled in an iteration is based on the second predetermined threshold value.

7. The method as claimed in claim 1, wherein the patrol status table is updated at each iteration of the step of the patrolling.

8. The method as claimed in claim 1, wherein the recycling comprises copying contents of the one or more valid pages into a free memory block in the memory.

9. The method as claimed in claim 6, wherein the first predetermined threshold value and the second predetermined threshold value are dynamically controlled by the user.

10. The method as claimed in claim 1 further comprises moving the one or more target memory blocks into a free memory block pool having one or more free memory blocks upon completion of the recycling of the one or more valid pages.

11. The method as claimed in claim 1 further comprises updating the memory status table upon completion of the recycling.

12. A memory management system for handling read disturb errors in a memory, the memory management system comprises:
    a processor; and
    the memory communicatively coupled to the processor, wherein the memory stores processor-executable instructions, which, on execution, causes the processor to:
        retrieve status information related to each of a plurality of memory blocks in the memory from a memory status table associated with the memory, wherein the status information includes a block erase count and a number of one or more valid pages in each of the plurality of memory blocks;
        identify one or more target memory blocks with the one or more valid pages and having a highest block erase count among the plurality of memory blocks;
        patrol each of the one or more valid pages in the one or more target memory blocks for identifying the read disturb errors in the one or more valid pages, wherein at least three different threshold counters are considered during initialization and execution of the patrol, (1) a first threshold counter corresponding to a first predetermined threshold value for initializing the patrolling based on a number of read-write memory operations, (2) a second threshold counter corresponding to a second predetermined threshold value for a user to trigger the patrolling based on a count of page read-write memory operations, and (3) a third threshold counter corresponding to a third predetermined threshold value for the user to set a number of valid pages to be patrolled when the patrol is triggered and initialized; and
        recycle the one or more valid pages having the read disturb errors for handling the read disturb errors in the memory, wherein
    the processor sets a status of patrolling of one or more of the plurality of memory blocks as patrolled when the one or more of the plurality of memory blocks are being used by an application running on the memory management system during the patrolling of the one or more of the plurality of memory blocks, and
    the processor stores a status of the patrolling in a patrol status table in the memory, wherein the patrol status table includes information related to the one or more valid pages which are not patrolled and target block information including at least a memory address of the one or more target memory blocks and a number of the one or more valid pages pending to be patrolled in the one or more target memory blocks.

13. The memory management system as claimed in claim 12, wherein the memory status table further comprises memory address mapping data, a target memory block count, and the number of the one or more valid pages to be patrolled in each of the one or more target memory blocks.

14. The memory management system as claimed in claim 12, wherein the processor initializes the patrolling when the number of read-write memory operations performed on the one or more valid pages is higher than at least one of the first predetermined threshold value or a user defined value in real-time.

15. The memory management system as claimed in claim 12, wherein the processor sets the status of patrolling of one or more of the plurality of memory blocks as patrolled when the one or more of the plurality of memory blocks are moved into a free memory block pool, the free memory block pool including one or more free memory blocks, based on one or more system operations.

16. The memory management system as claimed in claim 12, wherein the processor further iteratively patrols until each of the one or more valid pages which are not patrolled are patrolled.

17. The memory management system as claimed in claim 12, wherein a number of target memory blocks to be patrolled in an iteration is based on the second predetermined threshold value.

18. The memory management system as claimed in claim 12, wherein the processor updates the patrol status table at each time the one or more of the plurality of memory blocks are patrolled.

19. The memory management system as claimed in claim 12, wherein the processor copies contents of the one or more valid pages into a free memory block in the memory during the recycle.

20. The memory management system as claimed in claim 12, wherein the processor moves the one or more target memory blocks into a free memory block pool having one or more free memory blocks upon completion of the recycle of the one or more valid pages.

21. The memory management system as claimed in claim 12, wherein the processor updates the memory status table upon completion of the recycle.

* * * * *